United States Patent
Chan et al.

(10) Patent No.: US 9,947,677 B1
(45) Date of Patent: Apr. 17, 2018

(54) HIGH-DENSITY EEPROM ARRAYS HAVING PARALLEL-CONNECTED COMMON-FLOATING-GATE NFET AND PFET AS MEMORY CELL

(71) Applicant: INTERNATIONAL BUSINESS MACHINES CORPORATION, Armonk, NY (US)

(72) Inventors: Kevin K. Chan, Staten Island, NY (US); Bahman Hekmatshoartabari, White Plains, NY (US); Tak H. Ning, Yorktown Heights, NY (US); Jeng-bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/437,941

(22) Filed: Feb. 21, 2017

(51) Int. Cl.
*G11C 16/04* (2006.01)
*H01L 27/11521* (2017.01)
*G11C 16/10* (2006.01)

(52) U.S. Cl.
CPC ...... *H01L 27/11521* (2013.01); *G11C 16/045* (2013.01); *G11C 16/10* (2013.01)

(58) Field of Classification Search
CPC ..... G11C 29/789; G11C 16/16; H01L 27/115; H01L 29/7883
USPC ........................................ 365/185.05, 185.18
See application file for complete search history.

(56) References Cited

U.S. PATENT DOCUMENTS

| 8,705,280 | B2 | 4/2014 | Cai et al. | |
|---|---|---|---|---|
| 2010/0149873 | A1* | 6/2010 | Wang | G11C 16/0441 365/185.05 |
| 2011/0193586 | A1* | 8/2011 | Kuo | G01R 31/2621 324/762.08 |

OTHER PUBLICATIONS

John Robertson, "Band offsets of wide-band-gap oxides and implications for future electronic devices", Journal of Vacuum Science & Technology B: Microelectronics and Nanometer Structures. vol. 18. No. 3. May/Jun. 2000. pp. 1785-1791.

* cited by examiner

*Primary Examiner* — Son Dinh
(74) *Attorney, Agent, or Firm* — Tutunjian & Bitetto, P.C.; Louis J. Percello

(57) ABSTRACT

A memory array includes an N×M array of memory cells, each memory cell having a first transistor connected to a first terminal and a second transistor connected in parallel to the first transistor and a second terminal, where the first and second transistors share a common floating gate and a common output node. Each memory cell further includes an access transistor connected in series to the common output node and a low voltage terminal, the access transistor configured to trigger hot-carrier injection to the common floating gate to change a voltage of the common floating gate. The first transistor is an n-type transistor and the second transistor is a p-type transistor.

20 Claims, 5 Drawing Sheets

US 9,947,677 B1

HIGH-DENSITY EEPROM ARRAYS HAVING PARALLEL-CONNECTED COMMON-FLOATING-GATE NFET AND PFET AS MEMORY CELL

BACKGROUND

Technical Field

The present invention relates generally to programmable CMOS devices, and more specifically, to programmable CMOS devices comprising an NFET and a PFET with a commonly connected floating gate for storing electrical charges and methods of operating the same.

Description of the Related Art

Hot carrier injection is a phenomenon in semiconductor devices where a charge carrier (e.g., an electron or a hole) overcomes a potential barrier and, potentially, changes the behavior of a semiconductor device (such as, e.g., a complementary metal oxide semiconductor (CMOS) device). This phenomenon provides one mechanism for the design of an electrically erasable programmable read only memory (EEPROM), where the behavior of the device is stable over time but can be changed by the application of hot carrier injection.

However, existing designs for CMOS EEPROM devices suffer from inefficiencies in the application of hot hole injection. In particular, the use of silicon dioxide as a gate dielectric in CMOS devices results in a high energy barrier for the injection of hot holes (e.g., about 5 eV), such that the possible designs for CMOS EEPROM designs are limited.

SUMMARY

In accordance with an embodiment, a semiconductor structure is provided. The semiconductor structure includes a first transistor connected to a first terminal, a second transistor connected in parallel to the first transistor and a second terminal, where the first and second transistors share a common floating gate and a common node, and an access transistor connected in series to the common node and a low voltage terminal, the access transistor configured to trigger hot-carrier injection to the common floating gate to change a voltage of the common floating gate.

In accordance with an embodiment, a memory array is provided. The memory array includes an N×M array of memory cells, each memory cell comprising a first transistor connected to a first terminal, a second transistor connected in parallel to the first transistor and a second terminal, where the first and second transistors share a common floating gate and a common node, and an access transistor connected in series to the common node and a low voltage terminal, the access transistor configured to trigger hot-carrier injection to the common floating gate to change a voltage of the common floating gate.

In accordance with another embodiment, a method for storing information on a memory cell in a memory array formed from an N×M array of memory cells is provided. The method includes connecting a first transistor to a first terminal, connecting a second transistor in parallel to the first transistor and a second terminal, where the first and second transistors share a common floating gate and a common node, and connecting an access transistor in series to the common node and a low voltage terminal, the access transistor configured to trigger hot-carrier injection to the common floating gate to change a voltage of the common floating gate.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
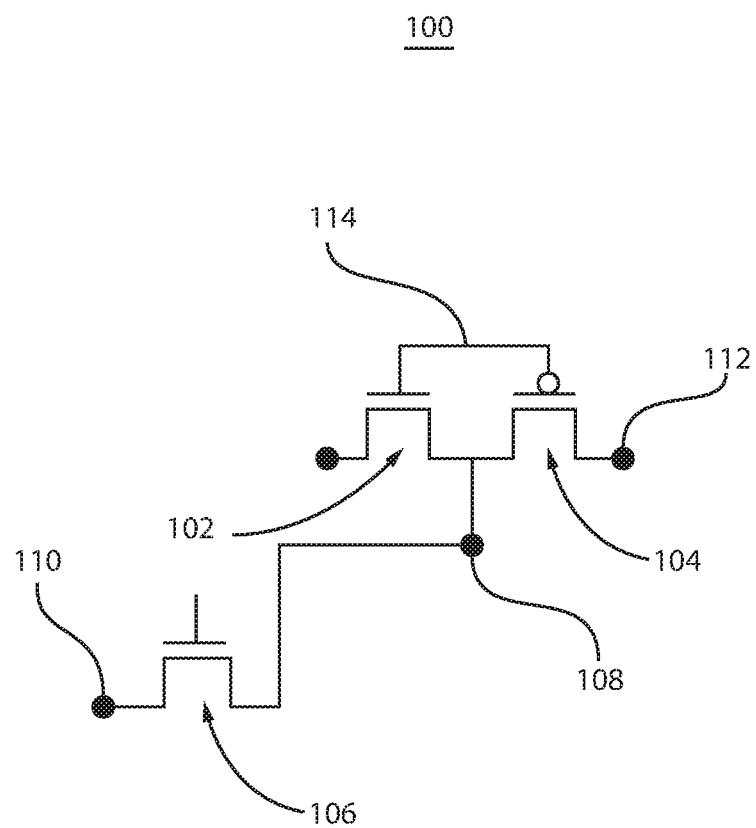
FIG. 1 is a circuit schematic of a memory cell, in accordance with the present invention.

In one or more embodiments, a semiconductor structure is provided. The semiconductor structure includes a first transistor connected to a first terminal, a second transistor connected in parallel to the first transistor and a second terminal, where the first and second transistors share a common floating gate and a common node, and an access transistor connected in series to the common node and a low voltage terminal, the access transistor configured to trigger hot-carrier injection to the common floating gate to change a voltage of the common floating gate.

In one or more embodiments, a memory array is provided. The memory array includes an N×M array of memory cells, each memory cell comprising a first transistor connected to a first terminal, a second transistor connected in parallel to the first transistor and a second terminal, where the first and second transistors share a common floating gate and a common node, and an access transistor connected in series to the common node and a low voltage terminal, the access transistor configured to trigger hot-carrier injection to the common floating gate to change a voltage of the common floating gate.

In one or more embodiments, a method for storing information on a memory cell in a memory array formed from an N×M array of memory cells is provided. The method includes connecting a first transistor to a first terminal, connecting a second transistor in parallel to the first transistor and a second terminal, where the first and second transistors share a common floating gate and a common output node, and connecting an access transistor in series to the common node and a low voltage terminal, the access transistor configured to trigger hot-carrier injection to the common floating gate to change a voltage of the common floating gate.

In one or more embodiments, a parallel-connected nFET/pFET with common floating-gate as a memory cell is provided that is capable of high efficiency programming/erasure utilizing avalanche hot-electron and hot-hole injections in the pFET and the nFET, respectively, and high-density memory arrays consisting of such memory cell are also provided.

In one or more embodiments, parallel connection of nFET and pFET enables symmetric operation of the nFET and pFET. One source/drain region of the pFET is connected to a pFET terminal and one source/drain region of the nFET is connected to an nFET terminal. The other source/drain region of the pFET and the other source/drain region of the nFET are connected together at a common node. An access transistor is connected in series to the common node and a low voltage terminal, which typically is at ground. When the access transistor is turned on, the common node is pulled down to the low voltage, and a voltage applied to the pFET terminal induces hot-electron injection in the pFET while a voltage applied to the nFET terminal induces hot-hole injection in the nFET. In one or more embodiments, a parallel-connected nFET/pFET EEPROM device is provided with common floating-gate having efficient avalanche hot-electron injection in a pFET and efficient avalanche hot-hole injection in an nFET.

In one or more embodiments, hot-carrier injection efficiency can be improved significantly by reducing the energy barrier for injection. Efficient avalanche hot-electron injection in a pFET is achieved by using $Si_3N_4$, $Y_2O_3$, $ZrO_2$, or $HfO_2$ for a gate dielectric. Efficient avalanche hot-hole injection in an nFET is achieved by using $Si_3N_4$, $Y_2O_3$, $ZrO_2$, or $HfO_2$ for a gate dielectric. The common-floating-gate parallel-nFET-pFET EEPROM device can be built on bulk Si, SOI, or using thin films of silicon on insulator. Due to the floating-body effect, avalanche hot-carrier injection is much more efficient in SOI, or thin-film polycrystalline Si on insulator devices than in bulk Si devices. There can also be a thin interfacial $SiO_2$ layer between device body (silicon) and high-k dielectric. The interfacial $SiO_2$ should be sufficiently thin, e.g. less than 1 nm, to allow efficient tunneling of hot carriers through it.

In one or more embodiments, EEPROM cells and memory arrays are provided employing common-floating-gate parallel-nFET-pFET devices having efficient avalanche hot-electron injection in a pFET and efficient avalanche hot-hole injection in an nFET, with one access transistor per wordline. The array is built on bulk Si, SOI, or thin films of polycrystalline Si on insulator. The CMOS peripheral circuits can be built on bulk or SOI silicon, independent of the array.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon-containing substrate examples of n-type dopants, i.e., impurities, include but are not limited to antimony, arsenic and phosphorous.

As used herein, an "enhancement mode" transistor refers to a field effect transistor including a channel having a doping of the opposite conductivity type as the doping of the source region and the drain region of the field effect transistor.

As used herein, a "depletion mode" transistor refers to a field effect transistor including a channel having a doping of the same conductivity type as the doping of the source region and the drain region of the field effect transistor.

As used herein, "output conductance" of a field effect transistor is a ratio of electrical current between a source region and a drain region of the field effect transistor to a voltage applied to across the source region and the drain region of the field effect transistor.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to FIG. 1, a circuit schematic is shown for a single electrically erasable programmable read only memory (EEPROM) cell 100. The EEPROM device 100 is formed from a first transistor 102 and a second transistor 104 with a shared gate terminal 114. The transistors 102, 104 are arranged in parallel with a source/drain region of the first transistor 102 and a source/drain region of the second transistor 104 connected together at a common node 108. The other source/drain region of the first transistor 102 is connected to a voltage terminal 116, and the other source/drain region of the second transistor 104 is connected to a voltage terminal 112. An access transistor 106 is connected to a low voltage terminal 110 and the common node 108 in series. When the access transistor is turned on, the common node 108 is pull down to approximately the same voltage as the low voltage terminal 110.

In one exemplary embodiment, the low voltage terminal 110 is at ground. It is specifically contemplated that the first transistor 102 is an nFET and that the second transistor 104 is a pFET. In one embodiment the access transistor 106 can be an nFET, though it should be understood that the particular configuration of the access transistor 106 can be adapted by those having ordinary skill in the art to the particular application. The first and second transistors 102 and 104 have a common output terminal 108.

The access transistor 106 controls writing to and reading from the EEPROM memory cell 100. The state of the device is held by the state of the common floating gate 114. When the access transistor 106 is turned on, it pulls the common terminal 108 to approximately the same voltage as the low voltage terminal 110. When the common terminal 108 is pulled down to the same voltage as the low voltage terminal 110, hot carrier injection to the gate could occur in the first transistor 102 if a sufficiently high voltage is applied to terminal 116, and hot carrier injection to the gate could occur in the second transistor 104 if a sufficiently high voltage is applied to terminal 112. These charges due to hot carrier injection will remain on the floating gates until neutralized by charges of the opposite polarity (e.g., negatively charged electrons will remain until they meet a positively charged hole and holes will remain until they meet an electron).

In a CMOS device, electrons are free to move about in the semiconductor conduction band and holes are free to move about in the semiconductor valence band. The conduction band of the gate dielectric is at a higher electron energy level than the semiconductor conduction band. This energy difference represents a barrier energy for an electron getting from the semiconductor into the gate dielectric. For an electron to jump from the semiconductor into the gate dielectric, it has to acquire a kinetic energy comparable to or greater than this barrier energy.

An electron having a kinetic energy larger than its thermal energy, which is determined by the semiconductor temperature, is referred to as a "hot" electron. Similarly the valence band of the gate dielectric is at a higher hole energy level than the semiconductor valence band. This energy difference represents a barrier energy for a hole getting from the semiconductor into the gate dielectric. For a hole to jump from the semiconductor into the gate dielectric, it has to acquire a kinetic energy comparable to or greater than this hole barrier energy. A hole having a kinetic energy larger than its thermal energy is referred to as a "hot" hole.

For an FET that uses silicon dioxide for a gate dielectric layer, hot electrons generally need a kinetic energy of about 3.1 eV, which is barrier energy for electrons to be injected efficiently from the FET semiconductor into the FET gate dielectric. Hot electrons having smaller kinetic energy of, e.g., about 2.8 eV, can still be injected from the FET semiconductor into the FET gate dielectric by a tunneling process which is very inefficient. For a hot hole in such an FET, a higher kinetic energy of about 4.8 eV, which is the barrier energy for holes, is needed for it to be injected efficiently from the FET semiconductor into the FET gate dielectric. Hot holes having smaller kinetic energy of, e.g., about 3.1 eV, can only tunnel from the FET semiconductor into the FET gate dielectric, but at a negligibly slow rate.

The charge on the shared floating gate 114 determines which of the two transistors is active. The accumulated charges on the shared floating gate 114 will determine the voltage on the gate of the devices relative to their source terminals and will turn those devices off or on, such that appreciable current will flow between terminal 116 and the common terminal 108 or between terminal 112 and common terminal 108 when the access transistor 106 is activated.

Figure 2:
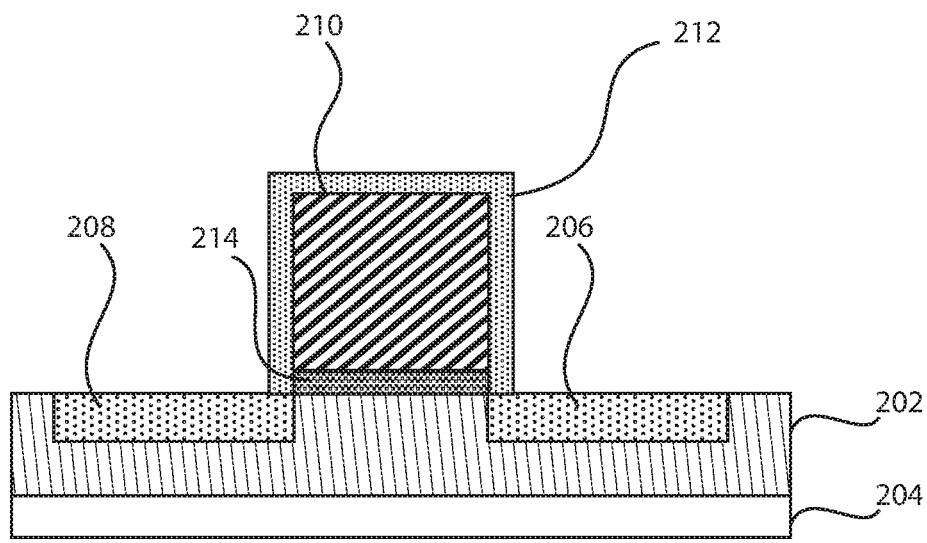
FIG. 2 is a cross-sectional diagram of a field effect transistor, in accordance with the present invention.

Referring now to FIG. 2, a diagram of an FET is shown. A semiconductor substrate 202 is formed, in one embodiment, on a buried dielectric layer 204. The buried dielectric 204 can be formed from silicon dioxide or any other appropriate dielectric material. The semiconductor substrate 202 can be formed from a silicon-containing material such as, e.g., silicon, silicon germanium, silicon germanium carbide, silicon carbide, polysilicon, epitaxial silicon, amorphous silicon, and multilayers thereof. Although silicon is the predominately used semiconductor material in wafer fabrication, alternative semiconductor materials can be employed such as, but not limited to, germanium, gallium arsenide, gallium nitride, cadmium telluride, and zinc selenide. In an alternative embodiment the semiconductor substrate 202 can be a bulk substrate without the buried dielectric layer 204.

Source and drain regions 206/208 are formed in or on the semiconductor layer 202. The source and drain regions 206/208 can be formed by implantation of an appropriate p-type or n-type dopant. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor in a silicon containing substrate examples of n-type dopants, i.e., impurities, include but are not limited to antimony, arsenic and phosphorous. A region of the semiconductor substrate 202 between the source and drain regions 206/208 is the channel region, and it is through the channel region that current flows when the device is activated. In one embodiment, source/drain regions 206/208 can extend into the substrate 202 until they reach the buried dielectric 204.

A gate 210 is formed with a gate dielectric 214 and a spacer 212 that insulate the gate from the source/drain regions 206/208 and the channel region. The gate dielectric 214 affects the properties of the device, in particular with respect to hot carrier injection. Efficient hot-electron injection can be achieved in pFETs using gate dielectrics such as, e.g., silicon nitride ($Si_3N_4$), yttrium oxide ($Y_2O_3$), zirconium oxide ($ZrO_2$), or hafnium oxide ($HfO_2$). Efficient hot hole injection can be achieved in nFETs using gate dielectrics such as, e.g., silicon nitride ($Si_3N_4$), yttrium oxide ($Y_2O_3$), zirconium oxide ($ZrO_2$), or hafnium oxide ($HfO_2$). Each of these materials provide energy barriers significantly lower than that imposed by silicon dioxide. These materials are referred to herein as low injection-barrier materials.

The use of low injection-barrier materials for the gate dielectric of nFETs makes it possible to implement the EEPROM device 100, in particular with the nFET taking the position of the first transistor 102, connected to the low voltage terminal 110 via the access transistor 106. This structure allows efficient injection (e.g., fast injection at low voltage) of hot holes in the nFET 102 into the common gate 114, thus turning on the nFET 102, and efficient injection of hot electrons in the pFET 104 into the common gate 114, thus turning off the nFET 102. The detailed operation of the EEPROM cell 100, including writing, erasing, and reading is described in greater detail below.

Figure 3:
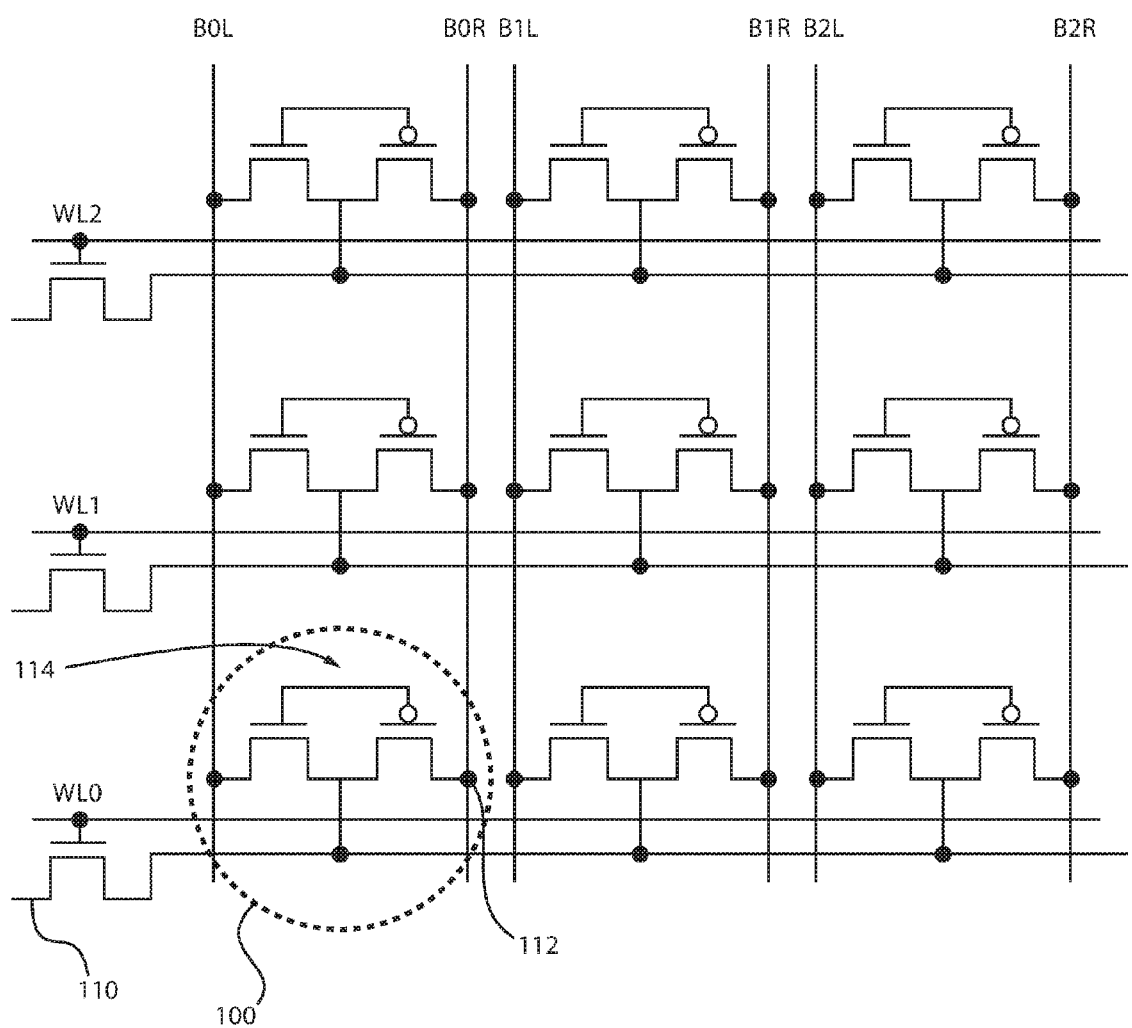
FIG. 3 is a circuit schematic of an array of memory cells, in accordance with the present invention.

Referring now to FIG. 3, an array 300 of EEPROM devices 100 is shown. This array 300 has a 3×3 grid of EEPROM devices 100, each with its access transistor connected to a low voltage at terminal 110 and to the common node 108 in series, the gate of the access transistor connected to wordline WL0, its terminal 112 of the parallel connected pFET connected to a bitline B0R, and its terminal 116 of the parallel connected nFET connected to a bitline B0L. It should be understood that an array of any size can be used instead. The array 300 can be built on, e.g., bulk semiconductor, semiconductor-on-insulator, or thin films of polycrystalline silicon on insulator.

The logic circuits that control the operation of a memory array can be fabricated on the same semiconductor substrate as the memory array to produce a memory chip, or they can be fabricated on a separate substrate and then packaged together with the memory array to form a memory package. These logic circuits are referred to herein as peripheral circuits. The peripheral circuits can be integrated with the memory array(s) on the same semiconductor substrate to improve speed and reliability. Alternatively, to reduce cost, which is important for large EEPROM systems, the peripheral circuits can be built on bulk semiconductor or semiconductor-on-insulator substrates independent of the array.

The common floating gate 114 of each EEPROM device 100 is programmed by avalanche hot-hole injection in the nFET 102 (writing a logical '1' to the device 100) and hot-electron injection in the pFET 104 (writing a logical '0'). Furthermore, the gate dielectric of the nFET 102 is chosen to enable fast injection of hot holes at low voltage, and the gate dielectric of the pFET 104 is chosen to enable fast injection of hot electrons at low voltage. As an example, for a pFET having $HfO_2$ as gate dielectric, hot-electron injection can be accomplished in less than 10 ns at a source-to-drain voltage of about 3V. For an EEPROM cell 100 operated with about 3V across its nFET 102 for avalanche hot-hole injection and about 3V across its pFET 104 for avalanche hot-electron injection, the applied voltages for array 300 during operation can be as follows.

When no action is being performed, during standby, the voltage on WL0=B0L=B0R=0V. The voltages for selecting a EEPROM device 100 for reading, writing a value '1' or writing a value '0' are as indicated in Table 1 below.

To write a value '1' to the EEPROM device 100, the wordline WL0 is raised to about 1.5 V to turn on the access transistor 106, pulling the common node 108 to about 0V (the voltage of terminal 110), the bitline B0R is dropped to about 0V so that there is little voltage across the pFET 104, and the bitline B0L is raised to about 3V, resulting in a voltage of about 3V across the nFET 102, causing hot-hole injection in the nFET 102.

To write a value '0' to the EEPROM device 100, the wordline WL0 raised to about 1.5 V to turn on the access transistor 106, pulling the common node 108 to about 0V (the voltage of terminal 110), the bitline B0L is dropped to about 0V so that there is little voltage across the nFET 102, and the bitline B0R is raised to about 3.0V to create a voltage of about 3V across the pFET 104, causing hot-electron injection in the pFET 104.

To read the value of the device, the wordline WL0 is raised to about 1.5V to turn on the access transistor 106, pulling the common node 108 to about 0V (the voltage of terminal 110), the voltage of B0L and B0R drops to about 1V, creating a voltage of about 1V across the nFET 102 and a voltage of about 1V across the pFET 104.

Table 1 shows the different values for WL0, B0L, and B0R for a cell (0,0) in the array. The voltage could vary by about 10% in this specific embodiment without affecting proper operation of the array.

In general, the time needed for hot-carrier injection in nFET 102 and pFET 104 is a strong function of the voltage across the devices during injection. For example, for a pFET having $SiO_2$ as gate dielectric, the rate of hot electron injection can increase by about 10× when the device voltage is changed from about 3V to about 3.5V. A 10% voltage variation is well within the design of typical integrated circuit chips.

TABLE 1

|  | WL0 | B0L | B0R |
|---|---|---|---|
| Write '1' | 1.5 V | 3.0 V | 0 V |
| Write '0' | 1.5 V | 0 V | 3.0 V |
| Read | 1.5 V | 1.0 V | 1.0 V |

For non-selected cells on the same wordline, for example when writing a '1' to another cell, the voltage across the nFET 102 will be about 0V and there will be negligible hot-hole injection in the nFET 102. Similarly, when writing a '0' in another cell, the voltage across the non-selected pFETs 104 will be about 0V, resulting in negligible hot-electron injection in the pFETs 104. For non-selected cells on the same output bitline the common node 108 is "floating," being isolated from terminal 110 because the access transistor is not turned on. This causes the voltage between bitline B0L and bitline B0R to be divided between the nFET and the pFET. The net result is that the voltage across either the nFET or the pFET is not large enough to cause hot carrier injection in either the nFET or the pFET.

The use of low injection-barrier materials in the EEPROM devices 100 provide superior efficiency, as significantly lower voltages can be used as compared to when conventional materials are used. For example, with a silicon dioxide gate dielectric layer, there is negligible hot-electron injection at voltages less than about 2.5V whereas, with a low injection-barrier material such as $HfO_2$, appreciable hot-electron injection can be achieved at voltages starting at about 1.5V. For programming with electron injection densities of about $1 \cdot 10^{12}$ /cm, a semiconductor-on-insulator pFET with an $HfO_2$ gate dielectric can be programmed in less than 10 ns at a voltage of 2.5V.

Figure 4:
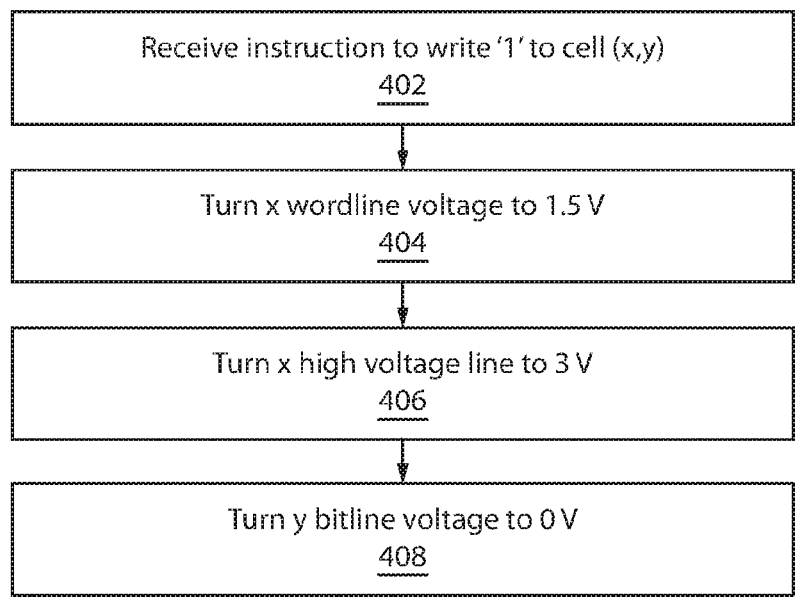
FIG. 4 is a block/flow diagram of a method of writing information to a memory cell, in accordance with the present invention.

Referring now to FIG. 4, a method of writing a logical '1' to an EEPROM device 100 is shown. Block 402 receives an instruction to write a logical '1' to the device 100 at cell (x,y) of an array (with x representing the horizontal index and y representing the vertical index). Block 404 turns the wordline voltage to 1.5V. Block 406 turns the voltage of the bitline connected to the nFET to, e.g., 3V. Block 408 turns the voltage of the bitline connected to the pFET to 0V. This creates a voltage of about 3.0V across the nFET 102 of the device 100 at cell (x,y), causing hot hole injection to the common floating gate 114.

Figure 5:
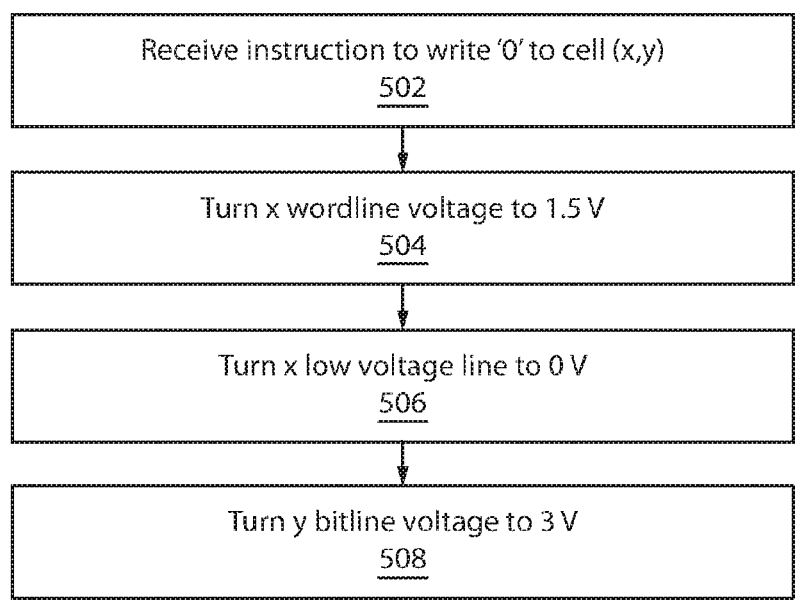
FIG. 5 is a block/flow diagram of a method of writing information to a memory cell, in accordance with the present invention.

Referring now to FIG. 5, a method of writing a logical '0' to an EEPROM device 100 is shown. Block 502 receives an instruction to write a logical '0' to the device 100 at cell (x,y) of an array. Block 504 turns the wordline voltage to 1.5V. Block 506 turns the voltage of the bitline connected to the nFET to 0V and block 508 turns the voltage of the bitline connected to the pFET to 3V. This creates a voltage of about 3.0V across the pFET 104 of the device 100 at cell (x,y), causing hot electron injection to the common floating gate 114.

Figure 6:
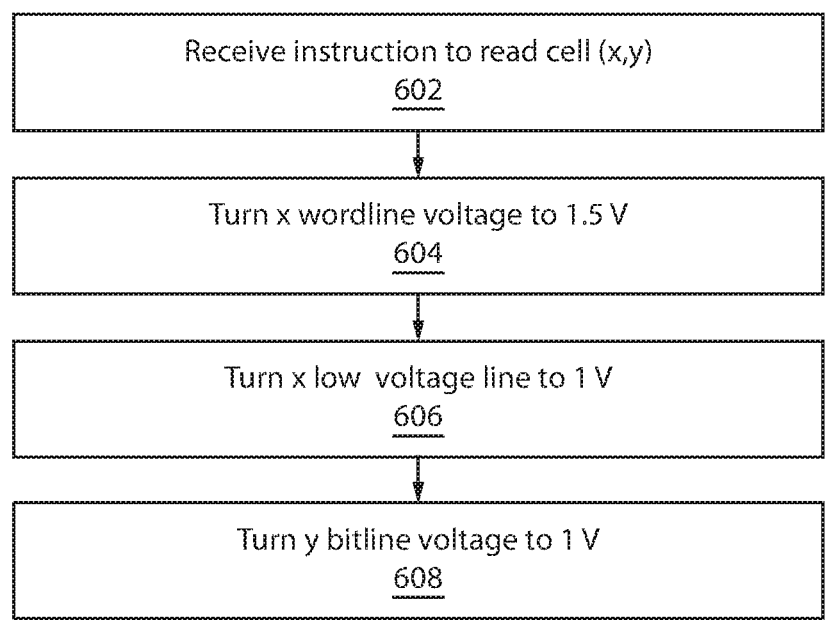
FIG. 6 is a block/flow diagram of a method of reading information from a memory cell, in accordance with the present invention.

Referring now to FIG. 6, a method of reading a value stored in an EEPROM device 100 is shown. Block 602 receives an instruction to read the logical value of the device 100 at cell (x,y) of an array. Block 604 turns the wordline voltage to 1.5V. Block 606 turns the voltage of the bitline connected to the nFET to 1V. Block 608 turns the voltage of the bitline connected to the pFET to 1V. This results in about 1V across the nFET 102 and about 1V across the pFET 104.

Depending on the charge of the common floating gate 114, the nFET 102 will be either turned on (i.e., conducting) or turned off (i.e., non-conducting). If the nFET 102 is conducting, a current will flow through the nFET 102 from the bitline connected to the nFET to the common output terminal 108, and continue on through the access transistor to terminal 110. If the nFET 102 is non-conducting, there is negligible current flow through the nFET 102 to the common output terminal 108 and through the access transistor 110.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for programmable CMOS devices comprising an NFET and a PFET with a commonly connected floating gate for storing electrical charges and methods of operating the same (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   a first transistor connected to a first terminal;
   a second transistor connected in parallel to the first transistor and a second terminal, such that the first and second transistors exhibit symmetric operational behavior, where the first and second transistors share a common floating gate and a common output node; and
   an access transistor connected in series to the common output node and a low voltage terminal, the access transistor configured to trigger hot-carrier injection to the common floating gate to change a voltage f the common floating gate.

2. The semiconductor device of claim 1, wherein the first transistor is an n-type transistor and the second transistor is a p-type transistor.

3. The semiconductor device of claim 1, wherein the first includes a low injection-barrier material gate dielectric and the second transistor includes a low injection-barrier material gate dielectric.

4. The semiconductor device of claim 1, wherein the first and second transistors are formed within a memory cell of an N×M array of memory cells.

5. The semiconductor device of claim 4, further comprising N bitline terminals connected to the first terminals of respective columns of memory cells.

6. The semiconductor device of claim 5, further comprising N bitline terminals connected to the second terminals of respective columns of memory cells.

7. The semiconductor device of claim 6, further comprising M terminals connected to the low voltage terminals of respective rows of memory cells.

8. The semiconductor device of claim 7, further comprising M access wordline terminals connected to access transistor gates of respective rows of memory cells.

9. The semiconductor device of claim 1, wherein hot-carrier injection is triggered when a voltage across one of the first transistor and the second transistor is about 3.0V.

10. The semiconductor device of claim 9, wherein a voltage of the common floating gate determines a logical state of the semiconductor device.

11. A memory array, comprising:
    an N×M array of memory cells, each memory cell comprising:
    a first transistor connected to a first terminal;
    a second transistor connected in parallel to the first transistor and a second terminal, such that the first and second transistors exhibit symmetric operational behavior, where the first and second transistors share a common floating gate and a common output node; and an access transistor connected in series to the common output node and a low voltage terminal, the access transistor configured to trigger hot-carrier injection to the common floating gate to change a voltage of the common floating gate.

12. The memory array of claim 11, wherein the first transistor is an n-type transistor and the second transistor is a p-type transistor.

13. The memory array of claim 11, further comprising N bitline terminals connected to the first terminals of respective columns of memory cells.

14. The memory array of claim 13, further comprising N bitline terminals connected to the second terminals of respective columns of memory cells.

15. The memory array of claim 14, further comprising M terminals connected to the low voltage terminals of respective rows of memory cells.

16. The memory array of claim 15, further comprising NI access wordline terminals connected to access transistor gates of respective rows of memory cells.

17. The memory array of claim 11, wherein hot-carrier injection is triggered when a voltage across one of the first transistor and the second transistor is about 3.0V.

18. The memory array of claim 11, wherein a voltage of the common floating gate determines a logical state of the semiconductor device.

19. A method of storing information on a memory cell in a memory array formed from an N×M array of memory cells, the method comprising:

connecting a first transistor to a first terminal;

connecting a second transistor in parallel to the first transistor and a second terminal, such that the first and second transistors exhibit symmetric operational behavior, where the first and second transistors share a common floating gate and a common output node; and connecting an access transistor in series to the common output node and a low voltage terminal, the access transistor configured to trigger hot-carrier injection to the common floating gate to change a voltage of the common floating gate.

20. The method of claim 19, wherein the first and second transistors are formed within a memory cell of an N×M array of memory cells each memory cell including:

N bitline terminals connected to the first terminals of respective columns of memory cells;

N bitline terminals connected to the second terminals of respective columns of memory cells;

M terminals connected to the low voltage terminals of respective rows of memory cells; and M access wordline terminals connected to access transistor gates of respective rows of memory cells.

* * * * *